United States Patent [19]

Sportelli

[11] 4,394,424

[45] Jul. 19, 1983

[54] PRINTING SCREEN AND METHOD OF MAKING SAME

[76] Inventor: Frank A. Sportelli, 7 Redwood Ct., Glen Cove, N.Y. 11542

[21] Appl. No.: 292,087

[22] Filed: Aug. 11, 1981

[51] Int. Cl.³ .......................... G03F 5/00; G03C 5/00
[52] U.S. Cl. ........................................ 430/6; 350/322; 430/7; 430/321; 430/394; 430/396; 430/952; 430/307; 430/310
[58] Field of Search ...................... 430/6, 7, 321, 394, 430/396, 952, 307, 310, 494; 350/322; 358/141

[56] References Cited

U.S. PATENT DOCUMENTS

| | | | |
|---|---|---|---|
| 2,206,054 | 7/1940 | Sease | 430/6 |
| 2,798,428 | 7/1957 | Tollenaar | 430/301 X |
| 3,581,660 | 6/1971 | Rapoport et al. | 101/450 |
| 3,664,843 | 5/1972 | Fontijn | 430/6 X |
| 3,737,321 | 6/1973 | Torr et al. | 430/6 X |
| 3,912,510 | 10/1975 | Marks | 430/6 X |
| 4,188,225 | 2/1980 | Liu | 430/7 |
| 4,283,471 | 8/1981 | Sportelli | 430/6 |

Primary Examiner—John E. Kittle
Assistant Examiner—Jose G. Dees
Attorney, Agent, or Firm—Neil F. Markva

[57] ABSTRACT

A printing plate is made in accordance with a particular method and is used in a printing process wherein it is effective to produce a substantially continuous tone printing effect. A negative screen having an overall pattern defined by rows of closely spaced substantially square-shaped areas is exposed two times on an image carrier. An image screen pattern is developed on the image carrier wherein each of the two exposures of the overall pattern on the negative screen is effected at an angle of 30° with respect to each other. A unique printing screen pattern is obtained which is then used for printing a reproduced image.

20 Claims, 5 Drawing Figures

U.S. Patent    Jul. 19, 1983    Sheet 1 of 2    4,394,424
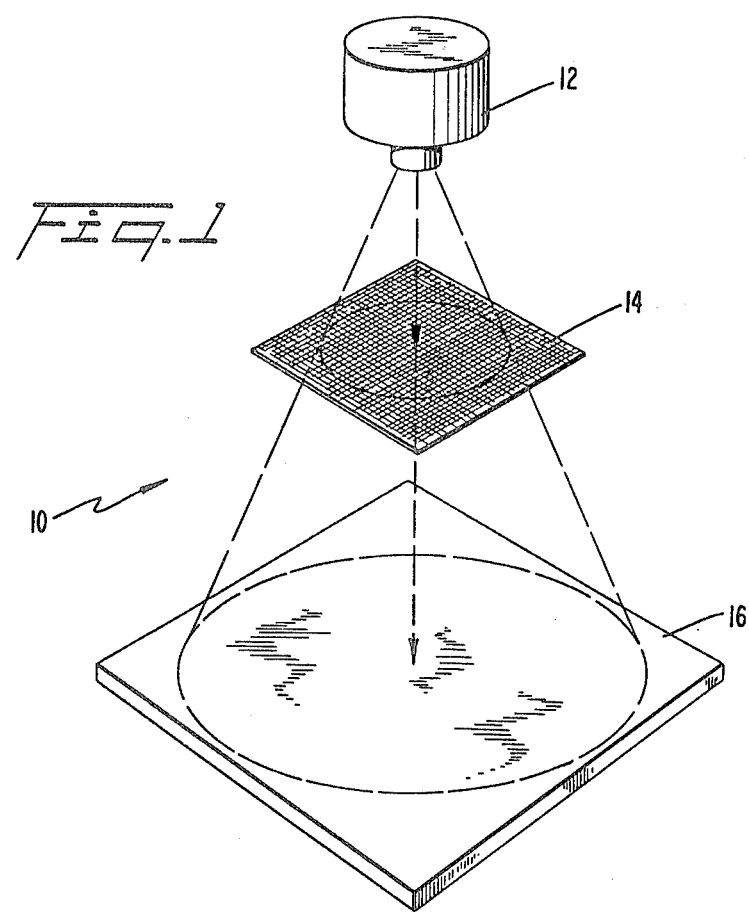
Fig.1
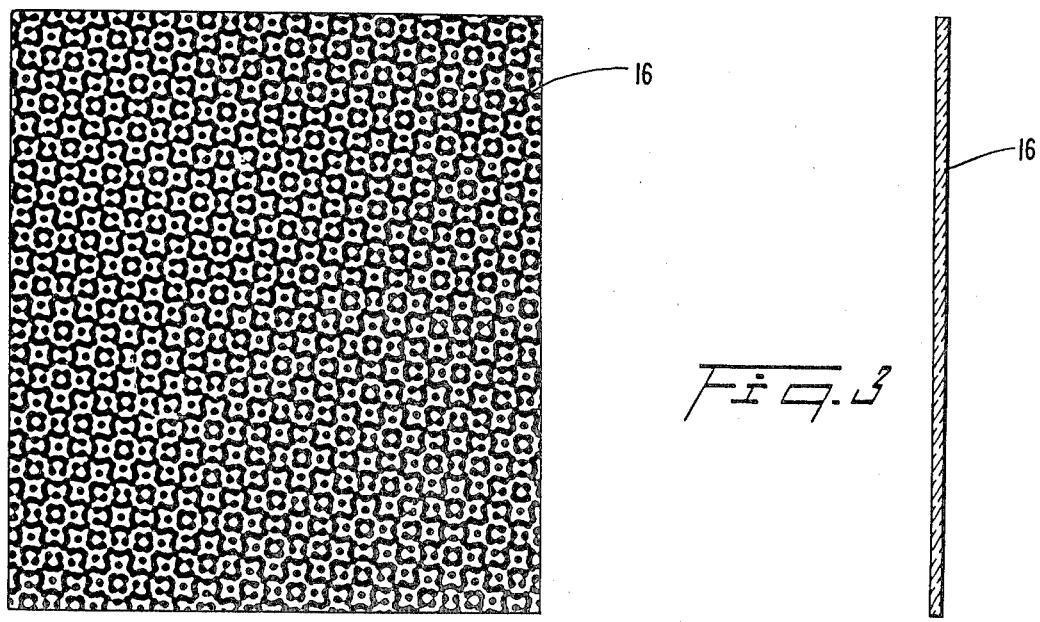
Fig.2
Fig.3

PRINTING SCREEN AND METHOD OF MAKING SAME

FIELD OF THE INVENTION

This invention relates to photoprinting image elements such as printing plates and a method of producing same for use in printing processes. More particularly, the invention relates to color reproduction printing such as gravure or intaglio printing involving the use of a novel screen pattern on a printing plate or light transmitting element.

BACKGROUND OF THE INVENTION

It is known to etch the printing surface of each printing plate used in color reproduction printing to provide circular or rectilinear patterns composed of a various number of wells or cells per square inch. The wells may all have the same surface area with varying depths to control the tonal shading or coloration. Alternatively, the depth of the wells may remain constant and the surface of the wells be varied to achieve the same differences in shading or tone and color reproduction. This style of printing is conventional and disclosed in U.S. Pat. No. 923,799.

This gravure type printing conventionally has well depths which vary from 35 microns for solid colors to 2 microns for the light color tones or tints. In some cases, greater depths are required. Wear along the printing surface rapidly changes the volume in the extremely shallow wells, thereby causing well known disadvantages. As known, each of the wells is separated by a bridge defined by a solid printing surface section. At the areas of contact between the paper and the bridge surface, there is no ink transfer. The small size of the individual wells, the bridge surfaces, the wear of the printing plate, and the inability of capillary action to adequately remove all of the ink from the well during the printing process wherein ink is transmitted from the well to the paper, each contributes to a discontinuous and irregular printing result.

Conventionally, a color image is reproduced by superpositioning imprints from a plurality of screen pattern, color separation plates. The multi-color photo engraving practice is often impaired by objectionable interference or moire patterns. These appear as objectionable grid patterns having a distinct geometric design. Furthermore, if the printed or reproduced image is magnified, a reproduction of the pattern of the printing screen is seen to exist. One prior art attempt to obviate this problem involves the use of a plurality of photoengravers' screens being rotated through different angles relative to a horizontal base line for several exposures onto the color separation plates used in the multi-color photoengraving printing process. That is, the separate screens are disposed, one on top of the other, and rotated to different angles with respect to a horizontal base line for the several exposures so that the lines of the screen patterns fall at different angles with respect to the base line. Each plate, or screen, used is for a different color. This prior art procedure is fairly common. However, the presence of a screen pattern in the reproduced image is still present.

The prior art associated with this particular field is exemplified by the U.S. Pat. Nos. 521,659; 1,872,943; 2,206,054; 2,360,587; 2,757,087; 2,768,577; 2,798,428; 3,288,059 and 3,450,044. All of these patentees describe printing procedures which are related to the production of printing screens and the use of same during the printing of a reproduced image. While these set forth conventional multi-screening procedures to reproduce both black and white and color reproductions, none of these prior art procedures has resulted in the production of a substantially continuous tone printing effect wherein the printed or reproduced image includes no trace of a screen or grid pattern particularly under magnified conditions.

The U.S. Pat. Nos. 2,200,285; 2,621,245 and 3,663,221 each relates to the use of separate gratings to transmit separate colors to an image screen. However, none address the specific problem solved with the instant invention.

In my copending U.S. application Ser. No. 90,763, now U.S. Pat. No. 4,283,471 I described a photoprinting image element and a method of making same for the purpose of producing a screened relief on a printing plate. I also described a printing screen pattern used in a printing process for producing a substantially continuous tone printing effect. While satisfactory results were obtained with my earlier invention, it has been discovered that imperfections such as wave forms appear under certain color printing conditions.

SUMMARY OF THE INVENTION

The primary object of this invention is to produce a light transmitting plate having a predetermined design if indicia thereon wherein said plate may be used during the printing of reproduced images.

Another object of the invention is to provide a photoprinting image element and a method of making same for the purpose of producing a screened relief pattern on a printing plate.

A further feature of the invention is to provide a printing screen pattern used in a printing process for producing a substantially continuous tone printing effect.

A still further object of the invention is to provide a method for producing an image screen pattern on an image carrier such as a photographic film, an engraved printing plate and the like.

The printing screen of this invention, referred to as an ILLETROPS screen, has a unique predetermined design composed of a pattern as specifically shown herein. It has been unexpectedly found that results obtained with the ILLETROPS screen of this invention constitutes an improvement over my earlier ILLETROPS screen. The method of the invention comprises exposing a negative screen having a plurality of parallel, equidistant lines located thereon onto a photographic film in two specific separate exposures. The negative screen is disposed at a predetermined angle in each of the separate exposures. Each said predetermined angle is at an angle of 30° with respect to each other. The exposed photographic film is then developed to produce a photoprinting image element having a screen pattern which may then be used to form a printing plate useful in conventional printing processes.

More specifically, the negative screen has an overall pattern comprising rows of closely spaced substantially square-shaped areas. The negative screen is a gravure negative screen and is first placed at a 105° angle and exposed onto a photographic graphic arts film. The fine line negative gravure screen is then placed at the 75° angle disposition and exposed onto the same film. The disposition of any grating at a particular angle is known in the printing industry. The developed film exposed according to the invention produces a product referred to as an ILLETROPS screen which is usable in the gravure process. The ILLETROPS screen has a very fine texture with properties which render it adaptable to gravure etching and press running. Such a screen of this invention has a firm foundation for corrections such as burnishing and chrome plating to increase press run life.

The ILLETROPS screen may be used for photoengraving and offset systems in addition to the gravure printing process. It has been found that even with low quality newspaper stock that reproduced images formed through printing with the ILLETROPS screen is substantially invisible on the reproduced image and thus creates a continuous tone printing effect. The results achieved in printing increase markedly with the better quality of paper stock used during the printing procedures.

BRIEF DESCRIPTION OF DRAWINGS

Other objects of this invention will appear in the following description and appended claims, reference being made to the accompanying drawings forming a part of the specification wherein like reference characters designate corresponding parts in the several views.

FIG. 1 is a perspective view of an assembly used to effect the process of the present invention;

FIG. 2 is a plan view showing the design of the light transmitting plate having an image developed according to the invention;

FIG. 3 is an elevational view of the screen of FIG. 2;

DETAILED DESCRIPTION

Figure 4:
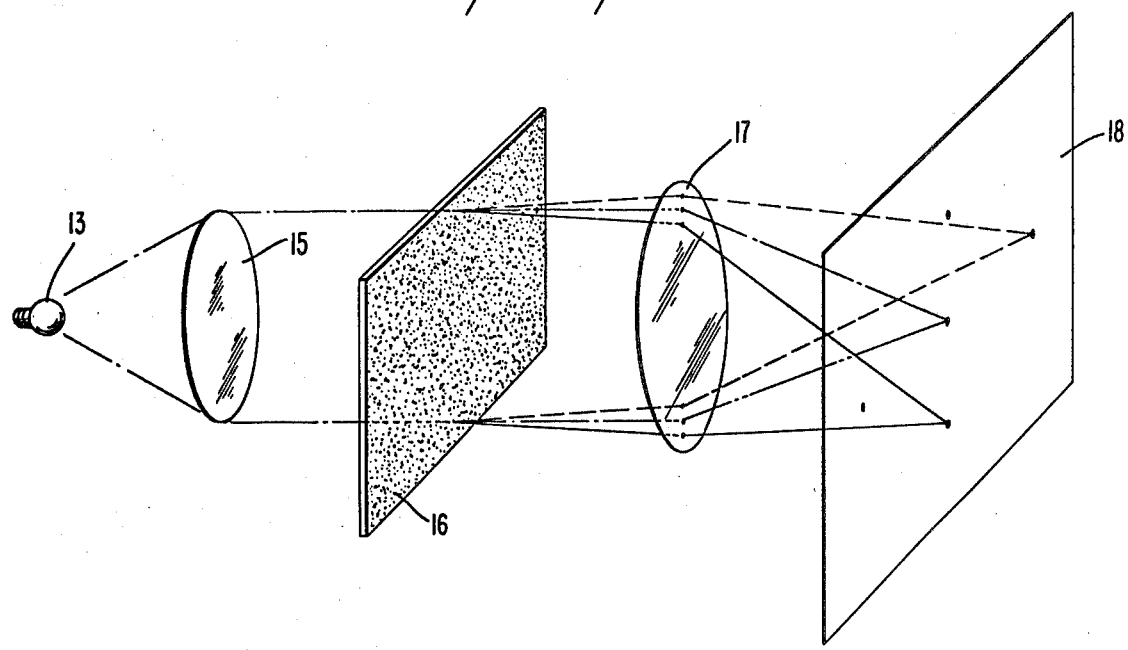
FIG. 4 is a schematic diagram showing the projection of light through a light transmitting element made in accordance with this invention.
Figure 5:
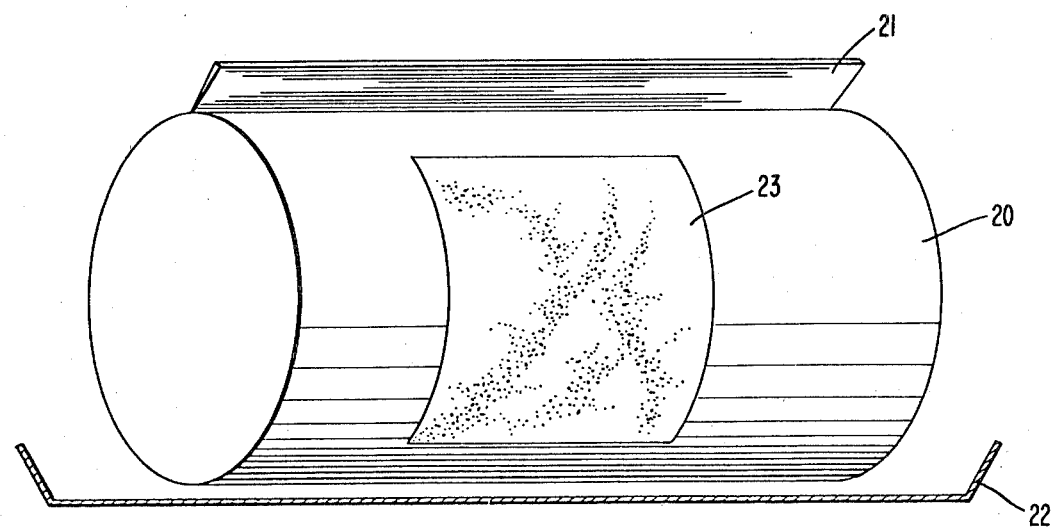
FIG. 5 is a perspective view partly in section showing a cylindrical printing plate bearing the image design made in accordance with the process of this invention to provide a multi-color reproduction.

A conventional assembly for producing a photoprinting image element is shown in FIG. 1. A film emulsion carrier 16 is positioned to receive an image as a result of the light projector 12. A gravure negative screen 14 is disposed between the projector 12 and the emulsion carrier 16 which may be a film emulsion such as DuPoint C.O.S. 4 or Eastman Ortho Type 3. The light source used in this embodiment is designated TAP 3 at 2400 Kelvin.

The photographic film emulsion 16 receives two separate exposures. The gravure negative screen 14 may have from about 200 to 300 lines per inch forming its grid pattern of squares. In this particular embodiment, the gravure screen 14 has 300 rulings or lines per inch. The first exposure onto the photographic film 16 is made with the screen 14 disposed on the 105° angle. A second exposure is then made on the 75° angle. As stated above, the disposition of any gravure screen grating at a particular angle is known in the printing industry. Each of the two exposures is made with the gravure screen 14 being disposed at angles that are 30° with respect to each other. In this particular embodiment, each exposure is about 7 seconds from the light source projector 12.

The photographic film 16 is then developed in a normal line developer which may be DuPont Crovalith processor. The developing time is about one minute.

The developed photographic film 16 shows a novel design which is then usable as a photoprinting image element having a regular screen pattern as shown. The precise disposition of the gravure screen 14 will render a screen pattern having no imperfections or moire effect. The exposed photographic film 16 with the pattern may be used in combination with a projected image as shown in FIG. 4 to obtain an image having no moire effect on the image seen on the screen. A light source 13 illuminates the image used in combination with the ILLETROPS screen 16 through the lens system 15. Images focused by the lens system 17 onto the image plane or projecting screen 18 are seen without any moire effects or patterns.

The multi-color image which is producible through the use of the ILLETROPS screen of this invention is achieved through the use of a series of printing plates 20 wherein each color being printed is used with a different plate. Each of the cylindrical printing plates 20 includes s source of ink in the shallow pan 22. Each plate 20 rotates with its outer surface moving into the ink carrying pan 22 and filling the various wells 23 formed in a pattern like that produced on the photographic film 16. The doctor blade 21 wipes any excess ink off the printing surface formed by the wells 23. The same pattern found on the photographic film 16 exists on each of the cylinders 20 used to print the various colors if there is a multi-color system. Obviously, if it is black and white printing, only one cylinder is necessary.

While the printing screen has been shown and described in detail, it is obvious that this invention is not to be considered as being limited to the exact form disclosed, and that changes in detail and construction may be made therein within the scope of the invention, without departing from the spirit thereof.

Having thus set forth and disclosed the nature of this invention, what is claimed is:

1. A method of making a photoprinting image element, said method comprising:
    (a) providing a negative screen having two sets of parallel equispaced lines located thereon, each said set being perpendicular to each other,
    (b) providing a photographic film to be exposed,
    (c) exposing the negative screen onto the photographic film in two separate exposures,
    (d) said negative screen being disposed at a predetermined angle in each said separate exposure,
    (e) each said predetermined angle being at a different angle with respect to each other, and
    (f) developing the exposed photographic film to produce a photoprinting image element having a regular screen pattern as shown in FIG. 2.

2. The method as defined in claim 1 wherein: the photographic film is an emulsion film.

3. The method as defined in claim 1 wherein: the negative screen is a gravure negative screen, and there is a separate exposure at each of the predetermined photoprinting angles of 105° and 75°.

4. The method as defined in claim 1 wherein: the negative screen has an overall pattern comprising rows of closely spaced substantially square-shaped areas.

5. The method as defined in claim 4 wherein: the negative screen has a sufficient number of lines per square inch effective to allow etching and printing on a gravure printing plate.

6. The method as defined in claim 5 wherein:

there are from about 100 to 300 lines per square inch on said screen.

7. The method as defined in claim 1 wherein:
said different angle is effective to produce an image having no moire on said photoprinting screen.

8. The method as defined in claim 1 wherein:
said image element is used to produce an engraved plate having a screen structure substantially identical to said screen pattern of the image element.

9. In the method of making a printing screen pattern, the process comprising:
(a) providing a negative screen having an overall pattern defined by rows of closely spaced substantially square-shaped areas,
(b) providing a light sensitive image carrier effective to receive two exposures of said overall pattern on the negative screen, exposing said carrier to said two exposures, and
(c) developing an image screen pattern as shown in FIG. 2 on said image carrier wherein each of said two exposures of said overall pattern on said negative screen is effected at a different angle on said image carrier.

10. The process as defined in claim 9 wherein:
said image carrier is a photographic film.

11. The process as defined in claim 9 wherein:
said image carrier is an engraved printing plate.

12. The process as defined in claim 9 wherein:
said image carrier is an image sheet used for producing a screened relief pattern on a printing plate.

13. The process as defined in claim 9 wherein: the separate angles of each exposure are spaced at 30° with respect to each other.

14. The process as defined in claim 13 wherein:
there is a separate exposure at each of the different angles of 105° and 75°.

15. In a printing process, the method comprising:
(a) providing a printing screen made in accordance with the process of claim 9, and
(b) using said printing screen for printing a reproduced image.

16. The method as defined in claim 15 wherein:
said printing process is a gravure printing process.

17. A light transmitting plate having a predetermined design of indicia thereon, said plate comprising:
(a) an indicia bearing side,
(b) said indicia being disposed on said indicia bearing side and being composed of photographically opaque material,
(c) said predetermined design as shown in FIG. 2.

18. A light transmitting plate as defined in claim 17 wherein:
said predetermined design includes a developed multiexposed photographic film emulsion defining said pattern.

19. In a television transmission process, the method comprising:
(a) providing a light transmitting element made in accordance with the process of claim 9, and
(b) using said light transmitting element for transmitting a reproduced image.

20. An engraved plate made in accordance with the method of claim 9.

* * * * *